United States Patent
Amano et al.

(10) Patent No.: US 10,098,256 B2
(45) Date of Patent: Oct. 9, 2018

(54) ELECTRONIC DEVICE

(71) Applicant: Mitsubishi Electric Corporation, Chiyoda-ku (JP)

(72) Inventors: Naoki Amano, Tokyo (JP); Tatsuumi Soyama, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/565,198

(22) PCT Filed: May 21, 2015

(86) PCT No.: PCT/JP2015/064638
§ 371 (c)(1),
(2) Date: Oct. 9, 2017

(87) PCT Pub. No.: WO2016/185613
PCT Pub. Date: Nov. 24, 2016

(65) Prior Publication Data
US 2018/0070471 A1    Mar. 8, 2018

(51) Int. Cl.
H05K 7/20 (2006.01)

(52) U.S. Cl.
CPC ..... *H05K 7/20145* (2013.01); *H05K 7/20909* (2013.01)

(58) Field of Classification Search
None
See application file for complete search history.

(56) References Cited

U.S. PATENT DOCUMENTS 4,035,711 A * 7/1977 Piller ............... H02K 5/24
                                            361/695
5,091,823 A * 2/1992 Kanbara ........... H02M 5/44
                                            174/351
(Continued)

FOREIGN PATENT DOCUMENTS

CN   1040726 A    3/1990
JP   06-077293 U  10/1994
(Continued)

OTHER PUBLICATIONS

Decision to Grant a Patent dated Sep. 13, 2016 in Japanese application No. 2016-535066 (with English translation).
(Continued)

*Primary Examiner* — Courtney Smith
(74) *Attorney, Agent, or Firm* — Oblon, McClelland, Maier & Neustadt, L.L.P.

(57) ABSTRACT

An electronic device includes a sealable housing, constituent surfaces of which are configured by a conductor, a plurality of heat generating components including a coil having a relatively large heating value during operation and an electrolysis capacitor having a heating value during operation relatively smaller than the heating value of the coil and having a heatproof temperature lower than the heatproof temperature of the coil, the heat generating components being housed on the inside of the housing, and an internal air fan housed on the inside of the housing. The electrolysis capacitor is housed above the coil. The internal air fan sends wind from one right side surface side of two side surfaces opposed to each other in the housing to the other side surface side between the coil and the electrolysis capacitor to thereby blow air between the electrolysis capacitor and the coil including heat generated by the coil against the other side surface.

5 Claims, 4 Drawing Sheets

(56) References Cited

U.S. PATENT DOCUMENTS

| | | | | |
|---|---|---|---|---|
| 5,424,915 | A | * | 6/1995 | Katooka ............ H05K 7/20909 |
| | | | | 361/695 |
| 6,665,183 | B1 | * | 12/2003 | Shikata .............. H05K 7/20918 |
| | | | | 257/721 |
| 8,837,140 | B2 | * | 9/2014 | Zurowski ........... H05K 7/20154 |
| | | | | 361/679.49 |
| 2002/0064028 | A1 | * | 5/2002 | Nielsen .............. H05K 7/20918 |
| | | | | 361/703 |
| 2004/0223301 | A1 | * | 11/2004 | Muller .................. H02M 7/003 |
| | | | | 361/699 |
| 2012/0181003 | A1 | * | 7/2012 | Zurowski ........... H05K 7/20154 |
| | | | | 165/121 |

FOREIGN PATENT DOCUMENTS

| | | |
|---|---|---|
| JP | 2005-063777 A | 3/2005 |
| JP | 2005-079242 A | 3/2005 |
| JP | 2011-103338 A | 5/2011 |
| JP | 2011-210806 A | 10/2011 |
| JP | 2012-119588 A | 6/2012 |
| JP | 2016-063714 A | 4/2016 |
| WO | 2012/032656 A1 | 3/2012 |

OTHER PUBLICATIONS

International Search Report dated Aug. 25, 2015 in PCT/JP2015/064638, filed on May 21, 2015.
Combined Chinese Office Action and Search Report dated Apr. 26, 2018 in Chinese Patent Application No. 201580080186.9 (with unedited computer generated English translation), 13 pages.

* cited by examiner

ELECTRONIC DEVICE

FIELD

The present invention relates to an electronic device including a heat generating component in a sealed housing.

BACKGROUND

In an electronic device, for normal operation and reliability securing of devices housed in a housing, it is necessary to retain the temperature of components at temperature equal to or lower than an allowable temperature of heat generating components. Depending on a type of an electronic device, for convenience of electric circuit connection, a high-heat generating component having a relatively large heating value during operation and having a high heatproof temperature is disposed in a lower part in a sealed housing and a low-heat resistant component having a heating value during operation relatively smaller than the heating value of the high-heat generating component and having a heatproof temperature lower than the heatproof temperature of the high-heat generating component is disposed in an upper part in the sealed housing.

As the electronic device having such a configuration, Patent Literature 1 discloses an electronic device in which an electrolysis capacitor, which is a low-heat resistant component, is disposed in an upper part and a solid polymer fuel battery, which is a heat generating component, is disposed in a lower part, in a housing. Patent Literature 1 mentions that, to protect the low-heat resistant component from heat radiation of the heat generating component in such a configuration, a flow of the air flowing to the solid polymer fuel battery is formed by rotation of a fan disposed on a side surface side of a blower and heat is transferred from the solid polymer fuel battery to the air. The air, to which the heat is transferred, is discharged to the outside from an air outlet of the housing. On the other hand, the air having a room temperature is taken into the housing anew from the outside through an air inlet of the housing.

CITATION LIST

Patent Literature

Patent Literature 1: Japanese Patent Application Laid-Open No. 2005-79242

SUMMARY

Technical Problem

However, in the electronic device, a sealed housing structure is sometimes adopted for waterproof and dustproof. In Patent Literature 1, because the housing is not sealed, it is possible to discharge the air having high temperature in the housing to the outside and take the air having the room temperature into the housing anew from the outside. However, in the electronic device including the sealed housing structure, because the air cannot be exchanged with the outside, a heat exhaust effect from the inside of the housing to the outside of the housing is deteriorated, the internal temperature of the housing rises, and the temperature of components housed in the housing also rises. The heat on the inside of the sealed housing concentrates in an upper part. Therefore, because of the influence of the heat concentration in the upper part on the inside of the sealed housing, a temperature limitation condition for the low-heat resistant component cannot be satisfied, performance such as life is seriously affected, and a use limitation is necessary.

Therefore, a method of directly guiding wind of the fan against the low-heat resistant component and directly cooling the component or a method of circulating the air on the inside of the housing with the fan to equalize the air is conceivable. However, although the air temperature inside the housing can be equalized by circulating the air inside the housing, a convection cooling effect for the low-heat resistant component by the heated air is small. Even if a cooling effect can be obtained, the temperature of a cooling target component does not drop to temperature equal to or lower than an average temperature of the air inside the housing. Even if the wind of the fan is directly guided against the low-heat resistant component, the temperature of the low-heat resistant component does not drop to the temperature equal to or lower than the average temperature of the air inside the housing. Therefore, there is a problem in that the temperature of the low-heat resistant component having a low allowable temperature cannot be retained at temperature equal to or lower than the allowable temperature.

The present invention has been devised in view of the above, and an object of the present invention is to obtain an electronic device including a sealed housing structure and capable of suppressing a temperature rise of components housed on the inside.

Solution to Problem

To solve the problems and achieve the object, the present invention provides an electronic device including: a sealable housing, surfaces of which are configured by a conductor; a plurality of heat generating components including a high-heat generating component having a relatively large heating value during operation and a low-heat resistant component having a heating value during operation relatively smaller than the heating value of the high-heat generating component and having a heatproof temperature lower than that of the high-heat generating component, the heat generating components being housed on an inside of the housing; and a blower housed on the inside of the housing. The low-heat resistant component is housed above the high-heat generating component. The blower sends wind, in a state in which the wind does not hit the high-heat generating component, from one side surface side of two side surfaces opposed to each other in the housing to the other side surface side between the high-heat generating component and the low-heat resistant component to thereby blow air between the low-heat resistant component and the high-heat generating component including heat generated by the high-heat generating component against the other side surface.

Advantageous Effects of Invention

The electronic device according to the present invention includes the sealed housing structure and achieves an effect that it is possible to suppress a temperature rise of components housed on the inside.

DESCRIPTION OF EMBODIMENTS

Electronic devices according to embodiments of the present invention are explained in detail below with reference to the drawings. Note that the present invention is not limited by the embodiments.

First Embodiment

Figure 1:
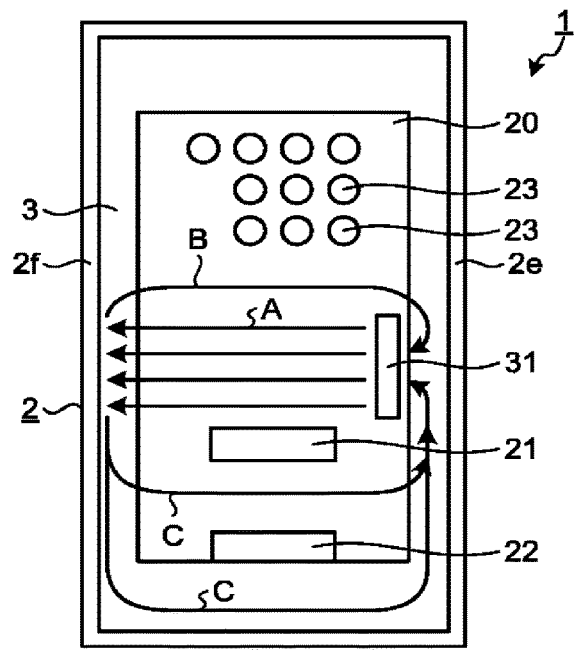
FIG. 1 is a schematic diagram showing a power conversion device according to a first embodiment of the present invention.
Figure 2:
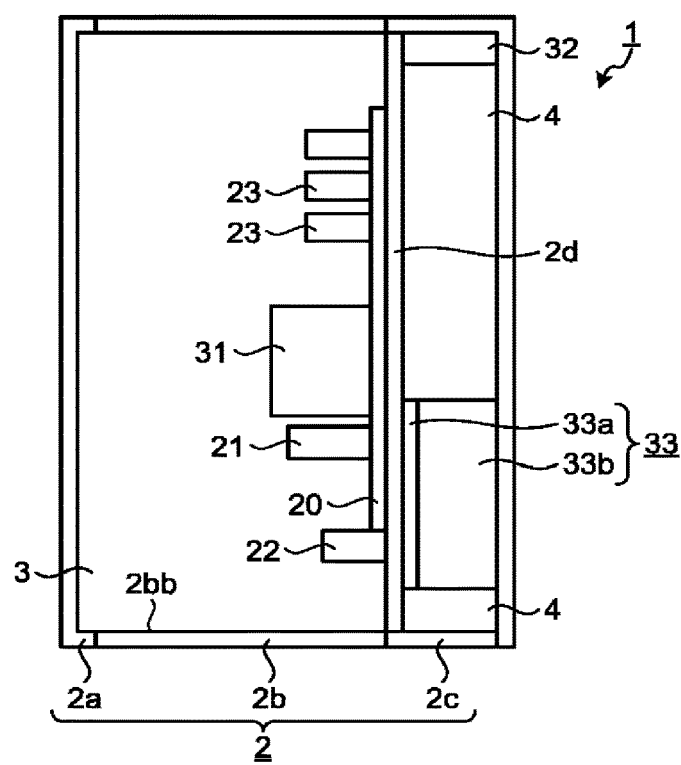
FIG. 2 is a side view of the power conversion device according to the first embodiment of the present invention.

FIG. 1 is a schematic diagram showing a power conversion device 1 according to a first embodiment of the present invention. In FIG. 1, a front view of a housing 2 in which electronic components configuring the power conversion device 1 are housed is shown. A general view of main components seen through a front surface portion of the housing 2 is shown. FIG. 2 is a side view of the power conversion device 1 according to the first embodiment of the present invention. A general view of main components seen through a side portion configuring the housing 2 is shown.

The power conversion device 1 includes the housing 2 that houses the electronic components configuring the power conversion device 1 and other components. The housing 2 is configured by connecting a divided plurality of housing components. The housing 2 is configured by a front surface section 2a having a tabular shape and disposed on the front side, a back surface section 2c having a cubic shape having an internal space and disposed on the back side, and a main body section 2b disposed between the front surface section 2a and the back surface section 2c and having a square cylinder shape. The front surface section 2a, the main body section 2b, and the back surface section 2c, which are constituent surfaces of the housing 2, are configured by a metal material or a resin material having high rigidity and having weather resistance against external environments such as wind and rain. From the viewpoint of exhaust of heat on the inside of the housing 2 to the outside of the housing 2, a metal material, which is a conductor having high thermal conductivity, is desirable. The height of the housing 2 is set to, for example, approximately 500 mm. However, not only this, but a smaller housing 2 or a larger housing 2 can be applied.

Not-shown seal grooves are formed on mutual contact surfaces, which are peripheral edge portions of the front surface section 2a and the main body section 2b. In a state in which a not-shown seal component is fit in the seal grooves, the peripheral edge portions of the front surface section 2a and the main body section 2b are fixed by screw components. Consequently, the front surface section 2a and the main body section 2b are fixed and the front surface section 2a and the main body section 2b are sealed by the seal component. With the same structure, the main body section 2b and the back surface section 2c are fixed and the main body section 2b and the back surface section 2c are sealed by the seal component. Consequently, a sealed housing section 3 surrounded by the front surface section 2a, the main body section 2b, and the back surface section 2c is configured. On the other hand, an internal space of the back surface section 2c is formed as a heat radiating section 4 that exchanges heat in the housing section 3 with the air. The heat radiating section 4 is not sealed to discharge the air in the heat radiating section 4 to the outside. Note that, in FIG. 1, connection structures among the housing components are omitted.

Although detailed explanation is omitted, a door for work is provided in the main body section 2b. Seal grooves are also provided in a peripheral edge portion of the door and a peripheral edge portion of an attaching section of the door in the main body section 2b. The housing section 3 is sealed by fixing the peripheral edge portions with screw components in a state in which a seal component is fit in the seal grooves.

The housing 2 is configured by the front surface section 2a, the main body section 2b, and the back surface section 2c, which are three divided housing components. However, the number of housing components configuring the housing 2 is not limited to three. As explained above, the seal grooves are provided in fixing sections among the housing components configuring the sealed housing section 3. The housing components are fixed in a state in which the seal components are fit in the seal grooves.

The power conversion device 1 includes, in the housing section 3, a power conversion circuit 11 that converts a three-phase alternating-current voltage supplied from an alternating-current power supply and generates a voltage required by an external load. The power conversion device 1 includes, in the housing section 3, an internal air fan 31, which is a blower that circulates the air in the housing section 3. The power conversion device 1 includes, in the heat radiating section 4, an outer-side heat exchange section 33, which is a heat sink for heat radiation in contact with an outer surface on an outer side of the housing section 3 on one wall surface 2d on the back surface section 2c side, the one wall surface 2d dividing the housing section 3 and the heat radiating section 4. The power conversion device 1 includes, in the heat radiating section 4, an external air fan 32, which is a blower that discharges the air in the heat radiating section 4 to the outside.

Note that the power conversion device 1 also includes other constituent members such as a control unit that that is configured by a microcomputer including a central processing unit (CPU) mounted on an electronic circuit board and controls the operations of constituent sections in the power conversion device 1, a display device that displays various kinds of information in the power conversion device 1, connection wires among the constituent sections, a connector and a cable for connection to an external apparatus, and an operation board. However, explanation and illustration of the constituent members are omitted.

Figure 3:
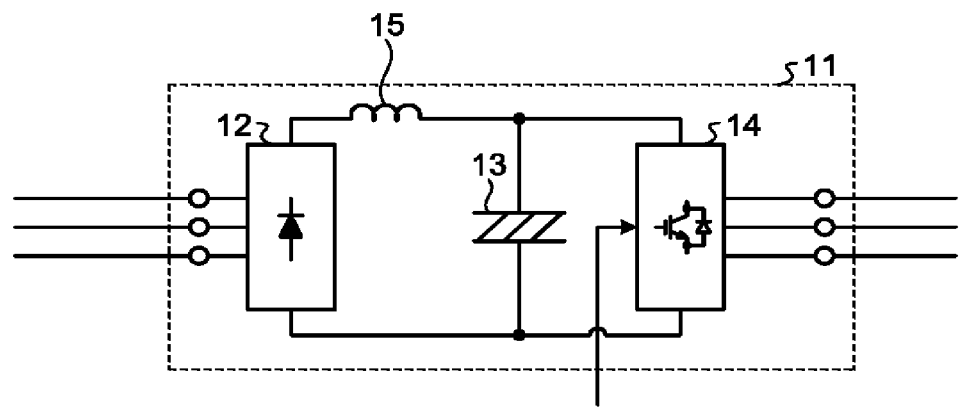
FIG. 3 is a circuit configuration diagram showing the configuration of a power conversion circuit according to the first embodiment of the present invention.

FIG. 3 is a circuit configuration diagram showing the configuration of the power conversion circuit 11 according to the first embodiment of the present invention. The power conversion circuit 11 includes: a rectifier circuit 12 that converts an alternating-current voltage supplied from an alternating-current power supply into a direct-current voltage; a smoothing circuit 13 that smoothes the direct-current voltage converted by the rectifier circuit 12; and a switching circuit 14 that converts the direct-current voltage after the smoothing into a three-phase alternating-current voltage according to switching control and supplies the three-phase alternating-current voltage to a load. The power conversion circuit 11 includes, between the rectifier circuit 12 and the smoothing circuit 13, a DC reactor 15 including a coil 21.

The rectifier circuit 12 includes a diode for rectification, which is a semiconductor element for electric power. The switching circuit 14 includes a semiconductor element for electric power such as a switching semiconductor element that switches direct-current power and converts the direct-current power into alternating-current power. The semiconductor elements for electric power are configured as a power module 22 housed in a package. The smoothing circuit 13 is configured using an electrolysis capacitor 23.

Heat generating components such as the electronic circuit board used in the control unit, a conductor for energization, and the coil 21 are high-heat generating components having a relatively large heating value during operation, having high temperature, and having high heat resistance. On the other hand, among the components housed in the housing section 3, heat generating components such as the electrolysis capacitor 23 and an IC (Integrated Circuit) are low-heat resistant components having a heating value during operation relatively smaller than the heating value of the high-heat generating components and having a heatproof temperature lower than the heatproof temperature of the high-heat generating components.

The electrolysis capacitor 23 configuring the smoothing circuit 13 is attached to, in the housing section 3, via an attachment plate 20, a region on an upper half side on the one wall surface 2d that divides the housing section 3 and the heat radiating section 4. The coil 21 configuring the DC reactor 15 is attached to, in the housing section 3, via the attachment plate 20, a region on a lower half side on the one wall surface 2d that divides the housing section 3 and the heat radiating section 4. A member is not disposed between the electrolysis capacitor 23 and the DC reactor 15. The power module 22 configuring the switching circuit 14 is attached to, in the housing section 3, a region on the lower half side on the one wall surface 2d that divides the housing section 3 and the heat radiating section 4, that is, a lower region of the coil 21.

The outer-side heat exchange section 33 is configured by disposing, in parallel, a plurality of thin external fins 33b configuring a heat exchange section on a principal plane of a flat base plate 33a at a predefined interval. The outer-side heat exchange section 33 is attached by setting the base plate 33a in contact with the one wall surface 2d in arrangement in which the external fins 33b are arrayed in parallel in the width direction of the power conversion device 1, that is, arrangement in which the external fins 33b extend in the height direction of the power conversion device 1. This enables the air to flow in the up-down direction through gap regions among the external fins 33b adjacent to one another. As a constituent material of the outer-side heat exchange section 33, a metal material having high thermal conductivity such as aluminum or copper is used.

The outer-side heat exchange section 33 is thermally connected to the power module 22 via the one wall surface 2d that divides the housing section 3 and the heat radiating section 4. Therefore, the outer-side heat exchange section 33 radiates heat of the power module 22 conducted through the one wall surface 2d to the internal air in the heat radiating section 4 from the external fins 33b and cools the power module 22. Note that "thermally connected" means a state in which, in a plane of the one wall surface 2d, the outer-side heat exchange section 33 and the power module 22 are opposed to and superimposed with each other, the outer-side heat exchange section 33 is in direct contact with the one wall surface 2d, and heat is directly transferred from the power module 22 via the one wall surface 2d. Therefore, "thermally connected" does not include a state in which the outer-side heat exchange section 33 and the power module 22 are not superimposed with each other at all in the plane of the one wall surface 2d.

The internal air in the heat radiating section 4 heated by the heat radiation of the outer-side heat exchange section 33 to have risen in temperature is sucked out by the external air fan 32 and discharged to the outside from an upper part of the heat radiating section 4.

The internal air fan 31 sends wind in the horizontal direction from a right side surface 2e side, which is one side surface, toward a left side surface 2f, which is the other surface side, of the right side surface 2e and the left side surface 2f, which are opposed two side surfaces sandwiched between the front surface section 2a and the back surface section 2c in the housing 2. That is, the internal air fan 31 blows wind in a direction perpendicular to the gravity direction. Note that the right side surface 2e is a side surface on the right side when viewed from the front of the housing 2 as shown in FIG. 1. The left side surface 2f is a side surface on the left side when viewed from the front of the housing 2 as shown in FIG. 1. The internal air fan 31 desirable sends wind having width that can include a region corresponding to the DC reactor 15 in the horizontal plane direction. The width means length in a direction perpendicular to the surface of the attachment plate 20. The internal air fan 31 can be one fan or a plurality of small fans can be disposed side by side laterally.

During driving of the power conversion device 1, the internal temperature, that is, the air temperature of the housing section 3 rises with heat generation from various heat generating components housed in the housing section 3. Consequently, the temperature of the heat generating components housed in the housing section 3 also rises. To normally operate the heat generating components housed in the housing section 3 and secure reliability, it is necessary to retain the temperature of the heat generating components at temperature equal to or lower than an allowable temperature of the heat generating components. In particular, concerning the low-heat resistant components, because heat resistance is lower than the heat resistance of the high-heat generating components, temperature needs to be retained lower. Particular caution is necessary concerning the low-heat resistant components having a maximum use temperature lower than the temperature during operation of the high-heat generating components.

As explained above, the electrolysis capacitor 23, which is a low-heat resistant component and configures the smoothing circuit 13, is disposed in the region on the upper half side in the housing section 3. The coil 21 configuring the DC reactor 15 and the power module 22, which are high-heat generating components, are disposed in the region on the lower half side in the housing section 3. Because the life of the electrolysis capacitor 23 decreases when the temperature of the electrolysis capacitor 23 rises, the temperature needs to be kept low.

Heat generated by the power module 22 is radiated to the internal air in the heat radiating section 4 via the one wall surface 2d and the outer-side heat exchange section 33. Therefore, it is possible to prevent the heat generated by the power module 22 from being staying in an upper region in the housing section 3.

On the other hand, the coil 21 is not cooled by the outer-side heat exchange section 33. Therefore, during driving of the power conversion device 1, the high-temperature air including heat generated by the coil 21 to have risen in temperature ascends to the upper region in the housing section 3 and raises the temperature of the air in the region on the upper half side in the housing section 3 in which the electrolysis capacitor 23, which is a low-heat resistant component, is disposed.

Because the power conversion device 1 includes a sealed housing structure, heat exhaust from the inside of the housing section 3 to the outside of the housing section 3 is mainly heat radiation via the housing 2. Compared with a housing including structure in which the inside of the housing communicates with the outside, a heat exhaust effect from the inside of the housing 2 to the outside of the housing 2 is deteriorated, the internal temperature of the housing 2 rises, and the temperature of the components housed in the housing 2 also rises.

Therefore, in the power conversion device 1, between the coil 21, which is the high-heat generating component, and the electrolysis capacitor 23, which is the low-heat resistant component, the internal air fan 31 sends wind from the right side surface 2e side toward the left side surface 2f, which are a pair of side surfaces opposed to each other in the housing 2, in width and a channel that can include a region corresponding to the coil 21 in the horizontal plane direction. That is, the internal air fan 31 sends wind using, as a channel of the wind, an upper part of the entire region of the DC reactor 15 in the horizontal plane direction. In the first embodiment, the channel of the wind sent from the internal air fan 31 is set in a position apart from the coil 21 upward by a predefined distance between the coil 21 and the electrolysis capacitor 23. The direction of the channel is set in the horizontal direction.

Consequently, the high-temperature air between the electrolysis capacitor 23 and the coil 21, in which the high-temperature air including the heat generated by the coil 21 to have risen in temperature and the air around the coil 21 are mixed, is directly blown against the left side surface 2f. That is, the high-temperature air in the upper part of the coil 21 including the heat generated by the coil 21 and radiated to the upward direction of the coil 21 is directly blown against the left side surface 2f by the wind sent from the internal air fan 31. The air sending by the internal air fan 31 is continued during the operation of the power conversion device 1.

The heat included in the high-temperature air blown against the left side surface 2f is transferred to the left side surface 2f, exchanged with the air on the outside of the power conversion device 1 via the left side surface 2f, and discharged to the outside of the housing 2. Consequently, it is possible to efficiently perform the heat exchange via the left side surface 2f between the high-temperature air blown against the left side surface 2f and the air on the outside of the power conversion device 1. That is, by forcibly blowing the high-temperature air including the heat generated by the coil 21 and radiated to the upward direction of the coil 21 against the left side surface 2f, it is possible to efficiently discharge the heat generated by the coil 21 to the outside of the power conversion device 1. Most of the air blown against the left side surface 2f is repeatedly blown toward the left side surface 2f while circulating as explained below. Consequently, it is possible to efficiently discharge the heat generated by the coil 21 to the outside of the power conversion device 1.

By forcibly blowing the high-temperature air including the heat generated by the coil 21 against the left side surface 2f before the high-temperature air ascends to the upper part in the housing 2, it is possible to separate the electrolysis capacitor 23, which is the low-heat resistant component, from the heat generated by the coil 21, which is the high-heat generating component. It is possible to prevent the heat generation of the coil 21 from easily affecting the electrolysis capacitor 23 and suppress a temperature rise of the electrolysis capacitor 23 due to the heat generation of the coil 21. Because the heat generated by the coil 21 can be efficiently discharged to the outside of the power conversion device 1 via the left side surface 2f, it is possible to suppress a temperature rise in the entire housing 2 due to the heat generation of the coil 21.

As indicated by an arrow A in FIG. 1, the high-temperature air blown against the left side surface 2f rebounds on the surface of the left side surface 2f and flows toward the right side surface 2e side in a peripheral region of a channel of the wind sent from the internal air fan 31 and the high-temperature air blown against the left side surface 2f such as an upper region, a lower region, or a lateral region of a channel of the wind sent from the internal air fan 31 and the high-temperature air blown against the left side surface 2f. That is, as indicated by an arrow B in FIG. 1, a part of the high-temperature air rebounding in the upward direction on the surface of the left side surface 2f flows toward the right side surface 2e side in an upper part of the channel of the wind sent from the internal air fan 31 and the high-temperature air blown against the left side surface 2f. A part of the high-temperature air rebounding in the upward direction on the surface of the left side surface 2f ascends along the left side surface 2f. However, when the part of the high-temperature air ascends, the heat of the air is transferred to the left side surface 2f and radiated from the left side surface 2f.

Figure 4:
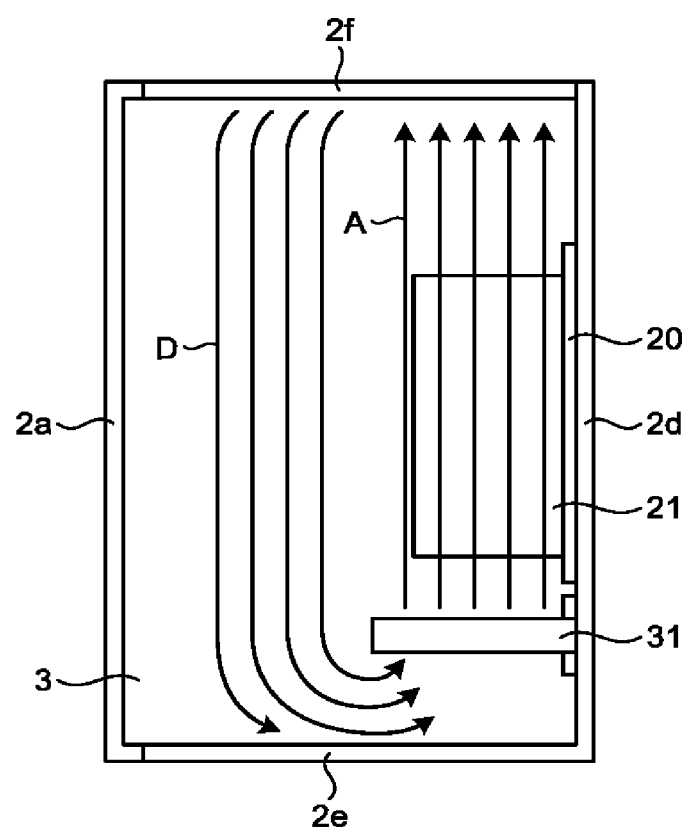
FIG. 4 is a schematic diagram showing a flow of high-temperature air rebounding in a lateral direction on the surface of a left side surface in the first embodiment of the present invention.

As indicated by an arrow D in FIG. 4, a part of the high-temperature air rebounding in the lateral direction on the surface of the left side surface 2f flows toward the right side surface 2e side between the channel of the wind sent from the internal air fan 31 and the high-temperature air blown against the left side surface 2f and the front surface section 2a. FIG. 4 is a schematic diagram showing a flow of the high-temperature air rebounding in the lateral direction on the surface of the left side surface 2f in the first embodiment of the present invention.

As indicated by an arrow C in FIG. 1, a part of the high-temperature air rebounding in the downward direction on the surface of the left side surface 2f flows toward the right side surface 2e side between the channel of the wind sent from the internal air fan 31 and the high-temperature air blown against the left side surface 2f and a bottom surface section 2bb. Note that, in the case of a configuration in which a space is present between the attachment plate 20 and the back surface section 2c, a part of the high-temperature air rebounding in the lateral direction on the surface of the left side surface 2f flows toward the right side surface 2e side between the attachment plate 20 and the back surface section 2c as well.

The air reaching the periphery of the internal air fan 31 is sucked by the internal air fan 31 and sent from the right side surface 2e side toward the left side surface 2f, which is the other side surface. That is, most of the air blown against the left side surface 2f flows toward the right side surface 2e side and is blown from the right side surface 2e side toward the left side surface 2f by the internal air fan 31 to circulate. At this point, the high-temperature air around the coil 21 including the heat generated by the coil 21 to have risen in temperature in a region below the channel of the wind sent from the internal air fan 31 and the high-temperature air blown against the left side surface 2f also circulates. That is, by performing the air sending by the internal air fan 31 in the upper part of the coil 21, it is possible to circulate the high-temperature air around the coil 21 and blow the high-temperature air against the left side surface 2f. Consequently, it is possible to efficiently perform heat exchange via the left side surface 2f between the high-temperature air blown against the left side surface 2f and the air on the outside of the power conversion device 1. Therefore, it is possible to efficiently discharge not only the heat generated by the coil 21 and radiated to the upward direction of the coil 21 but also the heat generated by the coil 21 and radiated to the periphery such as the downward direction and the lateral direction of the coil 21 to the outside of the power conversion device 1 via the left side surface 2f.

In this way, by blowing the wind of the internal air fan 31 against the high-temperature air heated by the heat generation of the coil 21 from the side surface between the coil 21 and the electrolysis capacitor 23, the high-temperature air circulates between the right side surface 2e and the left side surface 2f and circulates, mainly in the height direction of the housing 2, in a region at the same height or a region below the channel of the wind sent from the internal air fan 31 and the high-temperature air blown against the left side surface 2f. Consequently, the high-temperature air heated by the heat generation of the coil 21 less easily ascends to a region above the channel of the wind sent from the internal air fan 31 and the high-temperature air blown against the left side surface 2f. It is possible to suppress a temperature rise of the electrolysis capacitor 23 due to the heat generation of the coil 21.

Figure 5:
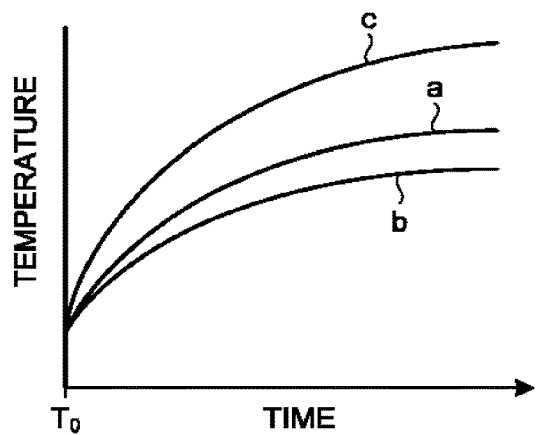
FIG. 5 is a characteristic chart schematically showing changes in the temperature of an electrolysis capacitor in the power conversion device according to the first embodiment of the present invention.

FIG. 5 is a characteristic chart schematically showing changes in the temperature of the electrolysis capacitor 23 in the power conversion device 1 according to the first embodiment of the present invention. In FIG. 5, the horizontal axis indicates time and the vertical axis indicates the temperature of the electrolysis capacitor 23. In FIG. 5, driving of the power conversion device 1 is started at time $T_0$.

In FIG. 5, a plot "a" indicates a change in the temperature of the electrolysis capacitor 23 in a case that the power conversion device 1 is driven. A plot "b" indicates a change in the temperature of the electrolysis capacitor 23 only by heat generation of the electrolysis capacitor 23 itself in a case that the power conversion device 1 is driven. A plot "c" indicates a change in the temperature of the electrolysis capacitor 23 in a case that the power conversion device 1 is driven without carrying out cooling by the internal air fan 31.

As shown in FIG. 5, when the plot "a" and the plot "b" are compared, the temperature of the electrolysis capacitor 23 in the case that the cooling by the internal air fan 31 is carried out is higher than a rising temperature of the electrolysis capacitor 23 only by the heat generation of the electrolysis capacitor 23 itself. This is influence due to a rise in the temperature of the air in the housing 2 by heat generation of the other heat generating components. On the other hand, when the plot "a" and the plot "c" are compared, the temperature of the electrolysis capacitor 23 in the case that the cooling by the internal air fan 31 is carried out is lower than the temperature in the case that the cooling by the internal air fan 31 is not carried out. As explained above, this is due to a suppression effect of a temperature rise of the electrolysis capacitor 23 due to the heat generation of the coil 21 and a reduction effect of the internal temperature in the entire housing 2 due to the heat generation of the coil 21.

Because a component that blocks wind is not disposed between the internal air fan 31 and the left side surface 2f, that is, on the channel of the wind sent from the internal air fan 31 and the high-temperature air blown against the left side surface 2f, it is possible to efficiently blow, against the left side surface 2f, the high-temperature air heated by the heat generation of the coil 21 and washed away the wind sent from the internal air fan 31. Consequently, a heat exchange amount of the high-temperature air including the heat generated by the coil 21 with the external air via the left side surface 2f increases. It is possible to suppress a temperature rise in the entire housing 2 due to the heat generation of the coil 21.

Note that, when a component is disposed between the internal air fan 31 and the left side surface 2f, that is, on the channel of the wind sent from the internal air fan 31 and the high-temperature air blown against the left side surface 2f, the component is desirably a component having a small wind blocking area such as a wire.

Because a temperature rise of the electrolysis capacitor 23 due to the heat generation of the coil 21 can be suppressed by the configuration explained above, it is possible to reduce the distance between the coil 21 and the electrolysis capacitor 23 in a range in which the electrolysis capacitor 23 can be retained at temperature equal to or lower than an allowable temperature at which the electrolysis capacitor 23 normally operates. It is possible to reduce the size of the power conversion device 1.

Figure 6:
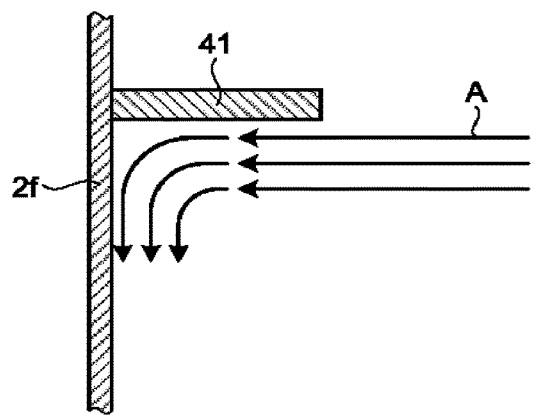
FIG. 6 is a schematic diagram showing a state in which a guide plate according to the first embodiment of the present invention is disposed on the left side surface.
Figure 7:
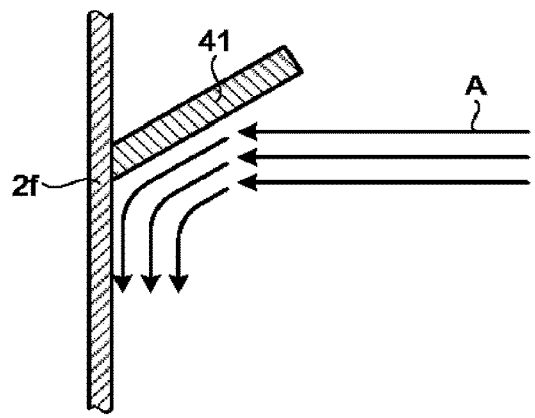
FIG. 7 is a schematic diagram showing the state in which the guide plate according to the first embodiment of the present invention is disposed on the left side surface.

As shown in FIG. 6 and FIG. 7, a tabular guide plate 41 that guides the air can be provided in a portion against which the high-temperature air heated by the heat generation of the coil 21 is blown on the left side surface 2f. FIG. 6 and FIG. 7 are sectional views showing a state in which the guide plate 41 according to the first embodiment of the present invention is disposed on the left side surface 2f.

By providing, in the horizontal direction, the guide plate 41 including a lower surface in a position higher than an upper end of the air blown against the left side surface 2f as indicated by an arrow A in FIG. 6, it is possible to guide air A blown against the left side surface 2f to the downward direction of the guide plate 41 and circulate the air A. Consequently, the high-temperature air heated by the heat generation of the coil 21 less easily ascends. It is possible to further suppress the temperature rise of the electrolysis capacitor 23 due to the heat generation of the coil 21.

As shown in FIG. 7, the guide plate 41 can be provided in arrangement in which a lower surface is formed as an inclined surface extending from the surface of the left side surface 2f toward an oblique direction and the air A blown against the left side surface 2f hits the lower surface. In this case, it is easier to guide the air A blown against the left side surface 2f to the downward direction of the guide plate 41. Consequently, the high-temperature air heated by the heat generation of the coil 21 less easily ascends. It is possible to further suppress the temperature rise of the electrolysis capacitor 23 due to the heat generation of the coil 21.

Note that, in the above explanation, the internal air fan 31 sends the wind in the channel having the width that can include the region corresponding to the coil 21 in the horizontal plane direction. However, when the internal air fan 31 does not send the wind having width that can include the entire width of the coil 21, that is, when the internal air fan 31 sends wind using a region corresponding to a part of the coil 21 in the horizontal plane direction as the channel of the wind sent from the internal air fan 31 and the high-temperature air blown against the left side surface 2f, it is also possible to suppress the temperature rise of the electrolysis capacitor 23, although an effect is smaller than the effect explained above.

In the above explanation, the coil 21 is separated from the bottom surface section 2bb of the housing 2. However, the coil 21 can be directly placed on the bottom surface section 2bb of the housing 2. In this case, the air blown against the left side surface 2f circulates, mainly in the height direction of the housing 2, in a region equal to or lower than the channel of the wind sent from the internal air fan 31 and the high-temperature air blown against the left side surface 2f.

As explained above, in the first embodiment, the wind of the internal air fan 31 is blown against the high-temperature air including the heat generated by the coil 21 to have risen in temperature from the right side surface 2e side toward the left side surface 2f to forcibly blow the high-temperature air against the left side surface 2f before the high-temperature air ascends to the upper part in the housing 2. Consequently, it is possible to efficiently discharge the heat generated by the coil 21 to the outside of the power conversion device 1.

In the first embodiment, the heat generated by the coil 21 can be efficiently discharged to the outside of the power conversion device 1 via the left side surface 2f. Therefore, it is possible to suppress a rise in the internal temperature in the entire housing 2 due to the heat generation of the coil 21.

In the first embodiment, the high-temperature air forcibly blown against the left side surface 2f can be circulated by the air sending from the internal air fan 31 in the height direction of the housing 2 in the region equal to or lower than the channel of the wind sent from the internal air fan 31 and the high-temperature air blown against the left side surface 2f. That is, it is possible to limit movement of the high-temperature air to only the periphery of the coil 21 such that the high-temperature air including the heat generated by the coil 21 to have risen in temperature does not spread in the entire housing 2. It is possible to separate the electrolysis capacitor 23, which is the low-heat resistant component, from the heat generated by the coil 21, which is the high-heat generating component. Consequently, it is possible to prevent the heat generation of the coil 21 from easily affecting the electrolysis capacitor 23 and suppress the temperature rise of the electrolysis capacitor 23 due to the heat generation of the coil 21.

Therefore, according to the first embodiment, it is possible to suppress a temperature rise of the electrolysis capacitor 23, which is the low-heat resistant component, housed in the housing 2 including the sealing structure, to temperature equal to or lower than an allowable temperature. Consequently, it is possible to normally operate the electrolysis capacitor 23 and improve characteristics and reliability of the electrolysis capacitor 23.

Second Embodiment

Figure 8:
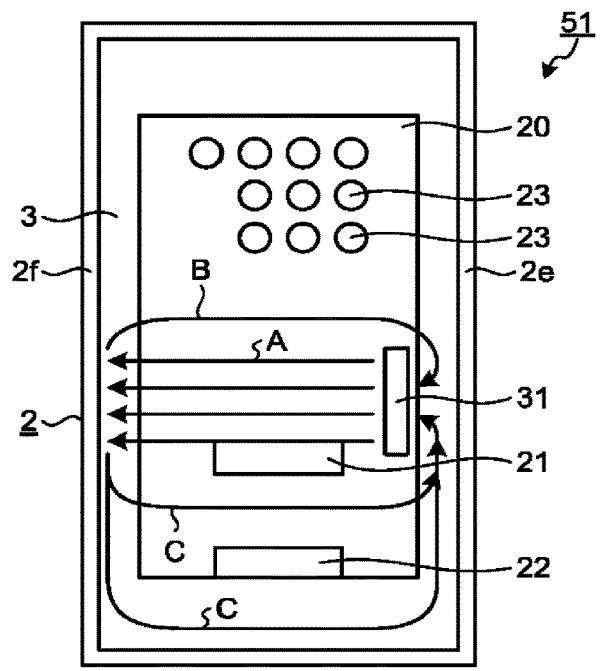
FIG. 8 is a schematic diagram showing a power conversion device according to a second embodiment of the present invention.

FIG. 8 is a schematic diagram showing a power conversion device 51 according to a second embodiment of the present invention. FIG. 8 is a figure corresponding to FIG. 1. FIG. 8 is a front view of the housing 2 in which electronic components configuring the power conversion device 51 are housed. FIG. 8 shows a general view of main components seen through a front surface portion of the housing 2. Note that the power conversion device 51 according to the second embodiment has the same configuration as the configuration of the power conversion device 1 according to the first embodiment except that an attachment position of the internal air fan 31 is lower than the attachment position in the power conversion device 1 according to the first embodiment.

In the power conversion device 51 according to the second embodiment, the internal air fan 31 is attached to a height position where the height of a lower end face of wind sent from the internal air fan 31 coincides with the height of the upper end portion of the coil 21. That is, in the power conversion device 51, in the height direction of the power conversion device 51, the lower end face of the channel of the wind sent from the internal air fan 31 and the upper end portion of the coil 21 are located on the same horizontal plane.

The internal air fan 31 sends wind in the horizontal direction from the right side surface 2e side toward the left side surface 2f. That is, the internal air fan 31 sends the wind in a direction perpendicular to the gravity direction. The internal air fan 31 desirably sends wind having width that can include a region corresponding to the DC reactor 15 in the horizontal plane direction. In the second embodiment, the internal air fan 31 can be one fan or a plurality of small fans can be disposed side by side laterally.

In the power conversion device 51 according to the second embodiment configured as explained above, it is possible to obtain the same effect as the effect of the power conversion device 1 according to the first embodiment.

Further, in the power conversion device 51 according to the second embodiment, before high-temperature air including heat radiated to an upper part of the coil 21 from the coil 21 to have risen in temperature is mixed with the air around the coil 21 to be cooled, the high-temperature air can be blown against the surface of the left side surface 2f by the wind of the internal air fan 31. Consequently, it is possible to more efficiently discharge the heat generated by the coil 21 to the outside of the power conversion device 51 via the left side surface 2f than in the case of the power conversion device 1 according to the first embodiment. Therefore, it is possible to further suppress the rise in the internal temperature in the entire housing 2 due to the heat generation of the coil 21. It is possible to further prevent the heat generation of the coil 21 from easily affecting the electrolysis capacitor 23 and further suppress the temperature rise of the electrolysis capacitor 23 due to the heat generation of the coil 21.

In the second embodiment, the wind sent from the internal air fan 31 is not hit against the coil 21 itself. The wind of the internal air fan 31 is blown from a side surface against the high-temperature air heated by the heat generation of the coil 21. Consequently, it is possible to effectively utilize the wind sent from the internal air fan 31 and efficiently blow the high-temperature air heated by the heat generation of the coil 21 against the left side surface 2f.

When the wind sent from the internal air fan 31 hits the coil 21, that is, when the lower end of the wind sent from the internal air fan 31 is present below the upper end portion of the coil 21, an amount of wind for blowing the high-temperature air heated by the heat generation of the coil 21 against the left side surface 2f decreases. The effect explained above decreases.

As explained above, with the power conversion device 51 according to the second embodiment 2, it is possible to more efficiently discharge the heat generated by the coil 21 to the outside of the power conversion device 1 via the left side surface 2f and further suppress the rise in the internal temperature in the entire housing 2 due to the heat generation of the coil 21. With the power conversion device 51 according to the second embodiment, it is possible to further prevent the heat generation of the coil 21 from easily affecting the electrolysis capacitor 23 and further suppress the temperature rise of the electrolysis capacitor 23 due to the heat generation of the coil 21.

Third Embodiment

Figure 9:
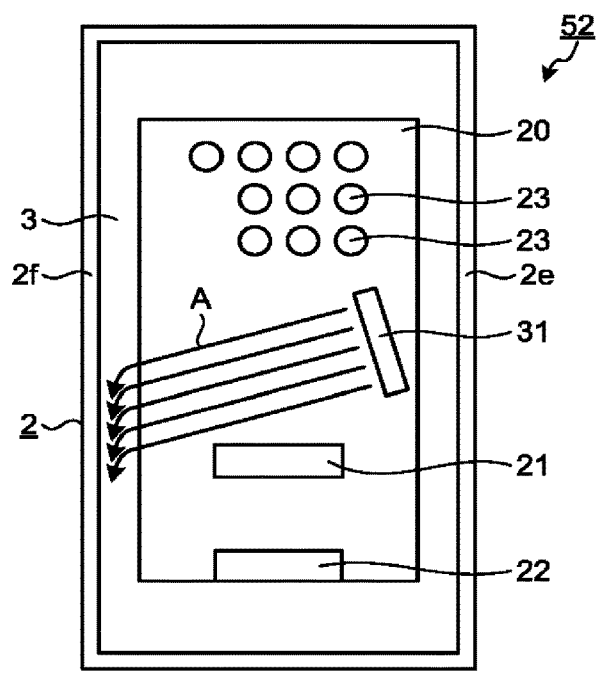
FIG. 9 is a schematic diagram showing a power conversion device according to a third embodiment of the present invention.

FIG. 9 is a schematic diagram showing a power conversion device 52 according to a third embodiment of the present invention. FIG. 9 is a front view of the housing 2 in which electronic components configuring the power conversion device 52 are housed. FIG. 8 shows a general view of main components seen through a front surface portion of the housing 2. Note that the power conversion device 52 according to the third embodiment has the same configuration as the configuration of the power conversion device 1 according to the first embodiment except that the internal air fan 31 is attached to incline with respect to a surface direction of the right side surface 2e and the left side surface 2f opposed to each other.

In the power conversion device 52 according to the third embodiment, the internal air fan 31 is attached in arrangement in which a channel of wind sent from the internal air fan 31 and high-temperature air blown against the left side surface 2f descends in a downward direction from the right side surface 2e toward the left side surface 2f of the housing 2. Therefore, the high-temperature air in an upper part of the coil 21 blown against the left side surface 2f by the wind sent from the internal air fan 31 is blown against the surface of the left side surface 2f downward from an oblique upward direction as indicated by an arrow A in FIG. 9. In this case, it is easier to guide the air blown against the left side surface 2f to the downward direction. Consequently, the high-temperature air heated by the heat generation of the coil 21 less easily ascends. It is possible to further suppress a temperature rise of the electrolysis capacitor 23 due to the heat generation of the coil 21.

As explained above, with the power conversion device 52 according to the third embodiment, the high-temperature air heated by the heat generation of the coil 21 much less easily ascends. It is possible to further suppress the temperature rise of the electrolysis capacitor 23 due to the heat generation of the coil 21.

The configurations explained in the embodiments indicate examples of the contents of the present invention. The configurations can be combined with other publicly-known technologies. A part of the configurations can be omitted or changed in a range not departing from the spirit of the present invention.

REFERENCE SIGNS LIST

1 power conversion device
2 housing
2a front surface section
2b main body section
2bb bottom surface section
2c back surface section
2d one wall surface
2e right side surface
2f left side surface
3 housing section
4 heat radiating section
11 power conversion circuit
12 rectifier circuit
13 smoothing circuit
14 switching circuit
15 DC reactor
20 attachment plate
21 coil
22 power module
23 electrolysis capacitor
31 internal air fan
32 external air fan
33 outer-side heat exchange section
33a base plate
33b external fin
41 guide plate
51, 52 power conversion device.

The invention claimed is:

1. An electronic device comprising:
a sealable housing to seal against an external environment of the electronic device, the housing including constituent surfaces that are configured by a thermal conductor;
a plurality of heat generating components including a high-heat generating component having a relatively large heating value during operation and a low-heat resistant component having a heating value during operation relatively smaller than the heating value of the high-heat generating component and having a heat-proof temperature lower than that of the high-heat generating component, the heat generating components being housed on an inside of the housing; and
a blower housed on the inside of the housing, wherein
the low-heat resistant component is housed above the high-heat generating component,
the blower sends wind, in a state in which the wind does not hit the high-heat generating component, from one side surface side of two side surfaces opposed to each other in the housing to the other side surface side between the high-heat generating component and the low-heat resistant component to thereby blow the wind between the low-heat resistant component and the high-heat generating component including heat generated by the high-heat generating component against the other side surface using the wind, and
a part of the wind between the low-heat resistant component and the high-heat generating component blown against the other side surface circulates to the one side surface side and is blown from the one side surface side toward the other side surface by the blower.

2. The electronic device according to claim 1, wherein the blower sends the wind in a horizontal direction.

3. The electronic device according to claim 2, wherein a height of a lower end stream of the wind coincides with a height of an upper end portion of the high-heat generating component.

4. The electronic device according to claim 1, wherein the blower sends the wind in a direction descending from the one side surface side toward the other side surface side.

5. The electronic device according to claim 1, wherein a member that blocks the wind is not disposed in a channel that sends the wind to the other side surface side.

* * * * *